(12) United States Patent
Hsieh et al.

(10) Patent No.: US 11,522,131 B2
(45) Date of Patent: Dec. 6, 2022

(54) RESISTIVE MEMORY DEVICE AND METHODS OF MAKING SUCH A RESISTIVE MEMORY DEVICE

(71) Applicant: GLOBALFOUNDRIES Singapore Pte. Ltd., Singapore (SG)

(72) Inventors: Curtis Chun-I Hsieh, Singapore (SG); Wanbing Yi, Singapore (SG); Benfu Lin, Singapore (SG); Cing Gie Lim, Singapore (SG); Wei-Hui Hsu, Singapore (SG); Juan Boon Tan, Singapore (SG)

(73) Assignee: GLOBALFOUNDRIES SINGAPORE PTE LTD, Singapore (SG)

( * ) Notice: Subject to any disclaimer, the term of this patent is extended or adjusted under 35 U.S.C. 154(b) by 0 days.

(21) Appl. No.: 16/945,058

(22) Filed: Jul. 31, 2020

(65) Prior Publication Data
US 2022/0037590 A1 Feb. 3, 2022

(51) Int. Cl.
*H01L 45/00* (2006.01)
*H01L 21/306* (2006.01)
*H01L 27/24* (2006.01)

(52) U.S. Cl.
CPC .... *H01L 45/1233* (2013.01); *H01L 21/30625* (2013.01); *H01L 27/24* (2013.01); *H01L 45/1253* (2013.01); *H01L 45/146* (2013.01)

(58) Field of Classification Search
CPC ............... H01L 45/1233; H01L 45/124; H01L 45/1253
See application file for complete search history.

(56) References Cited

U.S. PATENT DOCUMENTS

| | | | |
|---|---|---|---|
| 8,206,995 B2 * | 6/2012 | Reyes | ................. H01L 27/2481 438/3 |
| 10,439,134 B2 | 10/2019 | Majhi et al. | |
| 2007/0172964 A1 | 7/2007 | Yen et al. | |
| 2009/0091038 A1 | 4/2009 | Chen et al. | |
| 2009/0261433 A1 | 10/2009 | Kang et al. | |
| 2011/0155989 A1 * | 6/2011 | Park | ....................... H01L 45/124 438/102 |
| 2012/0032287 A1 | 2/2012 | Li et al. | |
| 2014/0131651 A1 | 5/2014 | Tu et al. | |
| 2015/0171314 A1 | 6/2015 | Li et al. | |
| 2016/0093668 A1 | 3/2016 | Lu et al. | |
| 2016/0133828 A1 | 5/2016 | Lu et al. | |

OTHER PUBLICATIONS

Kozicki and Barnaby, "Conductive bridging random access memory—materials, devices and applications," Semicond. Sci. Technol., 31:113001, 2016.
Li et al., "An overview of resistive random access memory devices," Chinese Science Bulletin, 56:3072-78, Oct. 2011.

* cited by examiner

*Primary Examiner* — Mark V Prenty
(74) *Attorney, Agent, or Firm* — Yee Tze Lim; Hoffman Warnick LLC

(57) ABSTRACT

An illustrative device disclosed herein includes a bottom electrode, a conformal switching layer positioned above the bottom electrode and a top electrode positioned above the conformal switching layer. The top electrode includes a conformal layer of conductive material positioned above the conformal switching layer and a conductive material positioned above the conformal layer of conductive material.

15 Claims, 4 Drawing Sheets

RESISTIVE MEMORY DEVICE AND METHODS OF MAKING SUCH A RESISTIVE MEMORY DEVICE

BACKGROUND OF THE INVENTION

Field of the Invention

The present disclosure generally relates to the fabrication of integrated circuits, and, more particularly, to various novel embodiments of a resistive memory device and various novel methods of making such a resistive memory device.

Description of the Related Art

In many modern integrated circuit products, embedded memory devices and logic circuits (e.g., microprocessors) are formed on the same substrate or chip. One form of such a memory device is an RRAM (resistive random access memory) device. An RRAM device has a relatively simple structure in that it typically comprises an insulating material that is positioned between a bottom electrode and a top electrode. The insulating material is often referred to as a resistive switching layer or simply a switching layer because the resistance of the insulating material changes upon application of an applied electrical field. Application of a voltage across the RRAM cell changes the device from a high resistance state to a low resistance state and vice versa. The high resistance state typically represents a low logic value (e.g., 0) while the low resistance state typically represents a high logic value (e.g., 1).

In one illustrative process flow, the materials for the bottom electrode, the switching layer and the top electrode are sequentially deposited above a metallization layer, e.g., M1, and thereafter patterned by performing traditional masking and etching process operations. During such etching processes, it has been observed that there can be some re-deposition of the materials that are being removed onto the RRAM device and that the etching process can damage the switching layer, all of which may reduce the performance capabilities of the RRAM device. Moreover, in at least some versions of prior art RRAM devices, the routing of electrical connection to the top electrode was done in the following metallization layer. For example, if the RRAM device was manufactured such that the upper surface was substantially co-planar with the upper surfaces of the metal lines in the M2 metallization layer, then the electrical connection to the top electrode of the RRAM would typically be made by a conductive via/metal line formed in the M3 metallization layer.

The present disclosure is generally directed to various novel embodiments of a resistive memory device and various novel methods of making such a resistive memory device.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel embodiments of a resistive memory device and various novel methods of making such a resistive memory device. One illustrative device disclosed herein includes a bottom electrode, a conformal switching layer positioned above the bottom electrode and a top electrode positioned above the conformal switching layer. In one illustrative example, the top electrode comprises a conformal layer of conductive material positioned above the conformal switching layer and a conductive material positioned above the conformal layer of conductive material.

One illustrative method disclosed herein includes forming a bottom electrode for a memory device, forming at least one layer of insulating material above the bottom electrode, forming an opening in the at least one layer of insulating material, wherein the opening exposes at least a portion of an upper surface of the bottom electrode, and performing at least one first conformal deposition process to form a conformal switching layer in the opening and above the bottom electrode. In one example, the method further includes performing at least one second conformal deposition process to form at least one conformal layer of conductive material in the opening and above the conformal switching layer, depositing a conductive material in the opening and above the at least one conformal layer of conductive material, and removing portions of the conformal switching layer, the at least one conformal layer of conductive material and the conductive material that are positioned outside of the opening and above an upper surface of the at least one layer of insulating material.

BRIEF DESCRIPTION OF THE DRAWINGS

The disclosure may be understood by reference to the following description taken in conjunction with the accompanying drawings, in which like reference numerals identify like elements, and in which.

Figure 1:
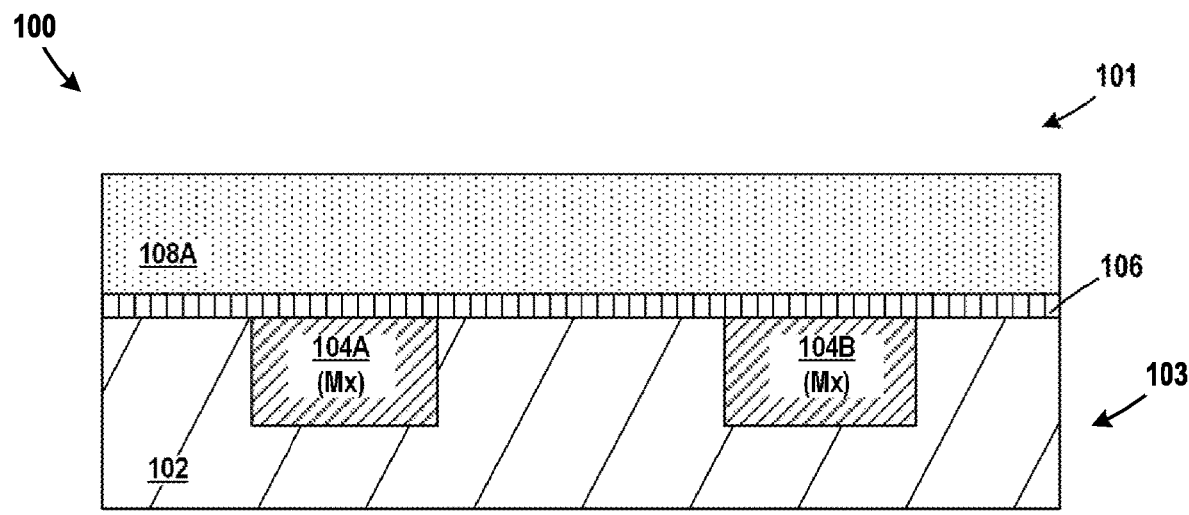
FIGS. 1-9 depict various novel embodiments of a resistive memory device and various novel methods of making such a resistive memory device. The drawings are not to scale.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As will be readily apparent to those skilled in the art upon a complete reading of the present application, the presently disclosed structures and method may be applicable to a variety of products, stand-alone memory products, embedded memory products, etc. The various components, structures and layers of material depicted herein may be formed using a variety of different materials and by performing a variety of known process operations, e.g., chemical vapor deposition (CVD), atomic layer deposition (ALD), a thermal growth process, spin-coating techniques, etc. The thicknesses of these various layers of material may also vary depending upon the particular application. With reference to the attached figures, various illustrative embodiments of the methods and devices disclosed herein will now be described in more detail.

FIGS. 1-9 depict various novel embodiments of an integrated circuit product 100 that includes a resistive memory device 101 and various novel methods of making such a memory device 101. As will be appreciated by those skilled in the art after a complete reading of the present application, the resistive memory device 101 depicted herein is intended to be generic and representative in nature. By way of example only, and not by way of limitation, the memory device 101 depicted herein may take a variety of forms, have a variety of different configurations, and may comprise different materials. For example, the memory device 101 depicted herein may be an RRAM (resistive random access memory) device or an ReRAM device. Such a memory device 101 includes some form of switching layer that is typically positioned between a bottom electrode and a top electrode. In some applications, some characteristic of the switching layer, e.g., resistivity, may be altered by the application of an electrical charge to the memory device 101, and these altered states may be representative of a logical "1" or a logical "0" in a digital circuit. In any event, sensing circuitry on the IC product 100 may be used to sense the resistivity of the memory device, to determine whether or not a particular memory device 101 represents a logical "1" or a logical "0" and use that information within the various circuits on the IC product 100. The particular materials used for the switching layer may vary depending upon the particular type of memory device that is fabricated. Moreover, the single layer of switching layer depicted in the drawings is intended to be representative in that, in a real-world device, the switching layer may comprise a plurality of layers of material. Thus, the reference to any switching layer in the specification and in the attached claims should be understood to cover any form of any material(s) that may be employed on any form of a resistive memory device that can be manipulated or changed so as to reflect two opposite logical states of the memory device. For purposes of disclosing the subject matter herein, the memory device 101 will be depicted as being an RRAM device, but the presently disclosed subject matter should not be considered to be limited to RRAM devices.

In addition to the memory device 101, the IC product 100 may contain other types of circuits or devices, e.g., logic circuits, read/write circuitry, input/output circuitry, etc. The IC product 100 will be formed above a semiconductor substrate (not shown). The semiconductor substrate may have a variety of configurations, such as a bulk silicon configuration. The substrate may also have a semiconductor-on-insulator (SOI) configuration that includes a base semiconductor layer, a buried insulation layer and an active semiconductor layer positioned above the buried insulation layer, wherein transistor devices (not shown) that are formed on the substrate are formed in and above the active semiconductor layer. The substrate may be made of silicon or it may be made of materials other than silicon. Thus, the terms "substrate" or "semiconductor substrate" should be understood to cover all semiconducting materials and all forms of such materials.

In general, and with reference to FIG. 1, the IC product 100 includes a plurality of metallization layers that constitute the overall wiring pattern for the various circuits on the IC product 100. These metallization layers may be formed by performing traditional manufacturing processes. These metallization layers are typically comprised of layers of insulating material (e.g., silicon dioxide, a low-k insulating material) with a plurality of conductive metal lines and conductive vias formed in the layers of insulating material. The conductive metal lines are routed across the substrate in various patterns and arrangements and provide the means for intra-layer electrical communication between the devices and structures formed on or above the substrate. The conductive vias provide the means for allowing inter-level electrical communication between the conductive metal lines in adjacent metallization layers. The first metallization layer of an IC product is typically referred to as the "M1" layer (or in some cases the "M0" layer), while the conductive vias that are used to establish electrical connection between the M1 layer and the conductive lines in the immediately adjacent upper metallization layer (the "M2 layer) are typically referred to as "V1" vias. So-called device level contacts (not shown) are formed above the substrate so as to provide electrical communication between the various devices, e.g., transistors, resistors, etc., that are formed on or immediately adjacent the semiconductor substrate.

FIG. 1 depicts the IC product 100 after several process operations were performed. More specifically, FIG. 1 depicts the IC product 100 at a point in time wherein an illustrative (and representative) metallization layer 103—Mx—was formed above the semiconductor substrate (not shown). As will be appreciated by those skilled in the art after a complete reading of the present application, the metallization layer 103 is intended to be representative of any metallization layer that may be formed on the IC product 100 irrespective of its location relative to an upper surface of the semiconductor substrate or any of the other metallization layers formed on the IC product 100, i.e., the metallization layer 103 is intended to be representative of any metallization layer formed at any level on the IC product 100.

With continued reference to FIG. 1, the IC product 100 is depicted at a point in time after several processing operations were performed. First, a layer of insulating material 102, e.g., silicon dioxide, for the representative metallization layer 103 (Mx) of the IC product 100 was formed above the semiconductor substrate. In the example shown in FIG. 1, various illustrative conductive metal lines 104A, 104B (collectively referenced using the numeral 104) have been formed in the layer of insulating material 102. The number, size, shape, configuration, and overall routing of the conductive lines 104 may vary depending upon the particular application. In one example, the conductive lines 104 are elongated features that extend across the IC product 100 in a direction that is transverse to the plane of the drawing in FIG. 1. The conductive lines 104 may be comprised of any of a variety of different conductive materials, e.g., copper, aluminum, tungsten, etc., and they may be formed by traditional manufacturing techniques, e.g., by performing a damascene process for cases where the conductive lines 104 are made of copper and perhaps by performing traditional deposition and etching processes when the conductive lines 104 are made of a conductive material that may readily be patterned using traditional masking and patterning (e.g., etching) techniques.

Still referencing FIG. 1, after forming the conductive lines 104, an etch stop layer 106 and another layer of insulating material 108A were formed on the IC product 100 by performing known deposition processes. The etch stop layer 106 may be comprised of any desired material, e.g., silicon nitride, carbon-doped nitride (NDC), NBLK, advanced etch stop layers like AlN/ODC etc., and it may be formed to any desired thickness. There will be three representative layers of insulating material 108A-C (collectively referenced using the numeral 108) formed on the IC product 100. The layers of insulating material 108 are representative in nature is that they each may represent a single layer of material or multiple layers of material. The layers of insulating material 108 may be formed to any desired thickness. The layers of insulating material 108 may be comprised of a variety of different insulating materials, e.g., silicon carbon nitride (SiCN), SiN, $Al_2O_3$, $HfO_x$, $SiO_2$, SiON, SiOCN, a low-k material, etc. If desired, a planarization process may be performed on the layers of insulating material 108 to substantially planarize its upper surface. The layers of insulating material 108 need not be made of the same material, but that may be the case in some applications.

Figure 2:
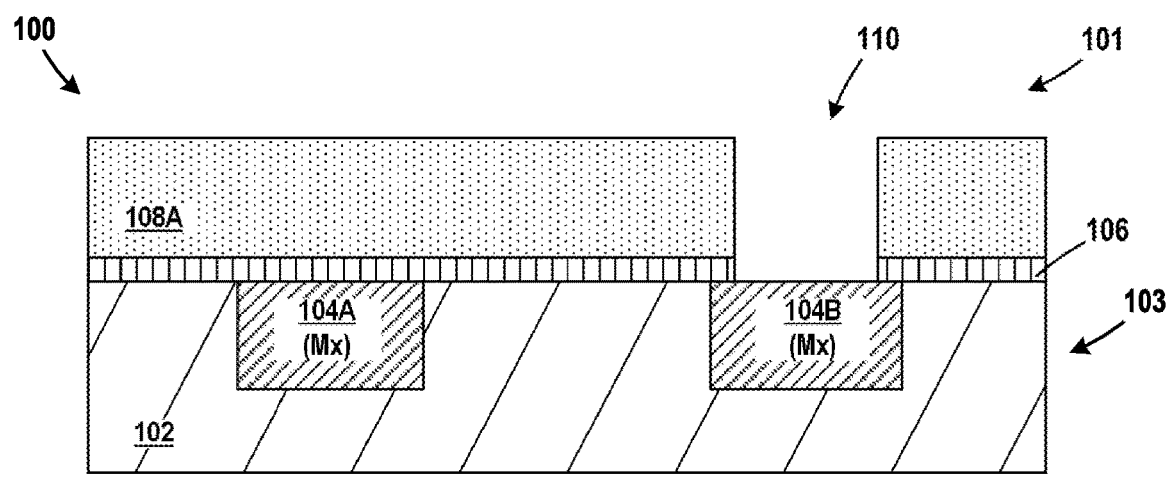

FIG. 2 depicts the IC product 100 after several process operations were performed. First, a first patterned etch mask (not shown), e.g., a patterned layer of photoresist, was formed on the IC product 100. The first patterned etch mask has an opening at a location above the conductive line 104B. At that point, a first etching process was performed through the first patterned etch mask (not shown) so as to remove exposed portions of the layer of insulating material 108A. This etching process operation stops on the etch stop layer 106. Thereafter, a relatively brief etching process may be performed to etch through the etch stop layer 106. These process operations result in the formation of an opening 110 that extends through the layer of insulating material 108A and the etch stop layer 106 and exposes at least a portion of the upper surface of the conductive line 104B. At that point, the first patterned etch mask was removed.

Figure 3:
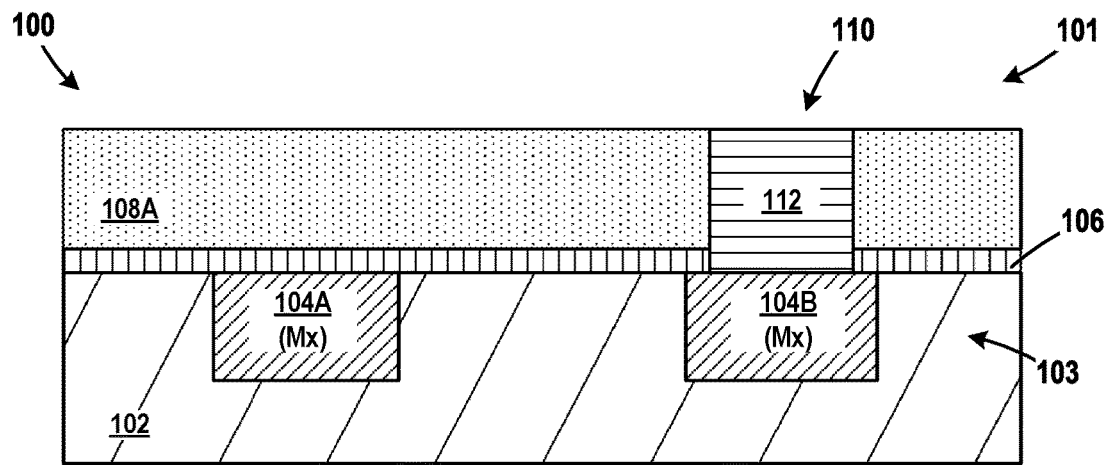

FIG. 3 depicts the IC product 100 after several process operations were performed. First, a layer of conductive material was deposited so as to overfill the opening 110. At that point, a planarization process, e.g., a chemical mechanical planarization (CMP) process operation and/or a dry etch-back process, was performed to remove the excess amounts of the conductive material positioned on or above the upper surface of the layer of insulating material 108A and outside of the opening 110. This results in the formation of a conductive bottom electrode 112 for the memory device 101. In one illustrative embodiment, when viewed from above, the conductive bottom electrode 112 may have a substantially circular configuration. In other situations, the conductive bottom electrode 112 may have a substantially oval configuration. The vertical thickness of the conductive bottom electrode 112 may vary depending upon the particular application. The conductive bottom electrode 112 may be comprised of a variety of conductive materials, e.g., a metal, a metal alloy, copper, tungsten, aluminum, Pt, TiN, TaN, etc. The conductive bottom electrode 112 may be comprised of the same material of construction as that of the conductive metal lines 104 to which it is conductively coupled, but that may not be the case in all applications. Of course, as will be appreciated by those skilled in the art after a complete reading of the present application, various barrier layers or liner layers (neither of which is shown) may be formed as part of the process of forming the illustrative conductive lines 104 and the conductive bottom electrode 112.

Figure 4:
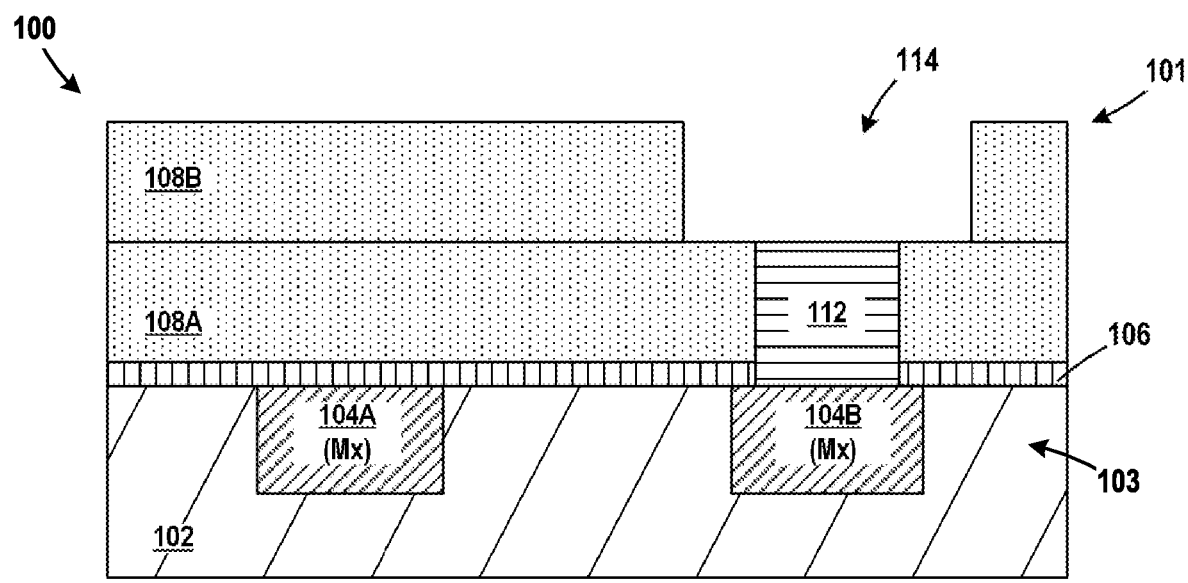

FIG. 4 depicts the IC product 100 after several process operations were performed. First, another representative layer of insulating material 108B was formed on the IC product 100. As before, the layer of insulating material 108B is representative in nature in that it may represent a single layer of material or multiple layers of material. The layer of insulating material 108B may be formed to any desired thickness, and it may comprise the same material as that of the layer of insulating material 108A, but that may not be the case in all applications. If desired, a planarization process may be performed on the layer of insulating material 108B to substantially planarize its upper surface. Then, a second patterned etch mask (not shown), e.g., a patterned layer of photoresist, was formed on the IC product 100. The second patterned etch mask has an opening at a location above the conductive bottom electrode 112. At that point, an etching process was performed through the second patterned etch mask (not shown) so as to remove exposed portions of the layer of insulating material 108B. This etching process operation results in the formation of an opening 114 that extends through the layer of insulating material 108B and thereby exposes at least a portion of the upper surface of conductive bottom electrode 112. At that point, the second patterned etch mask was removed.

Figure 5:
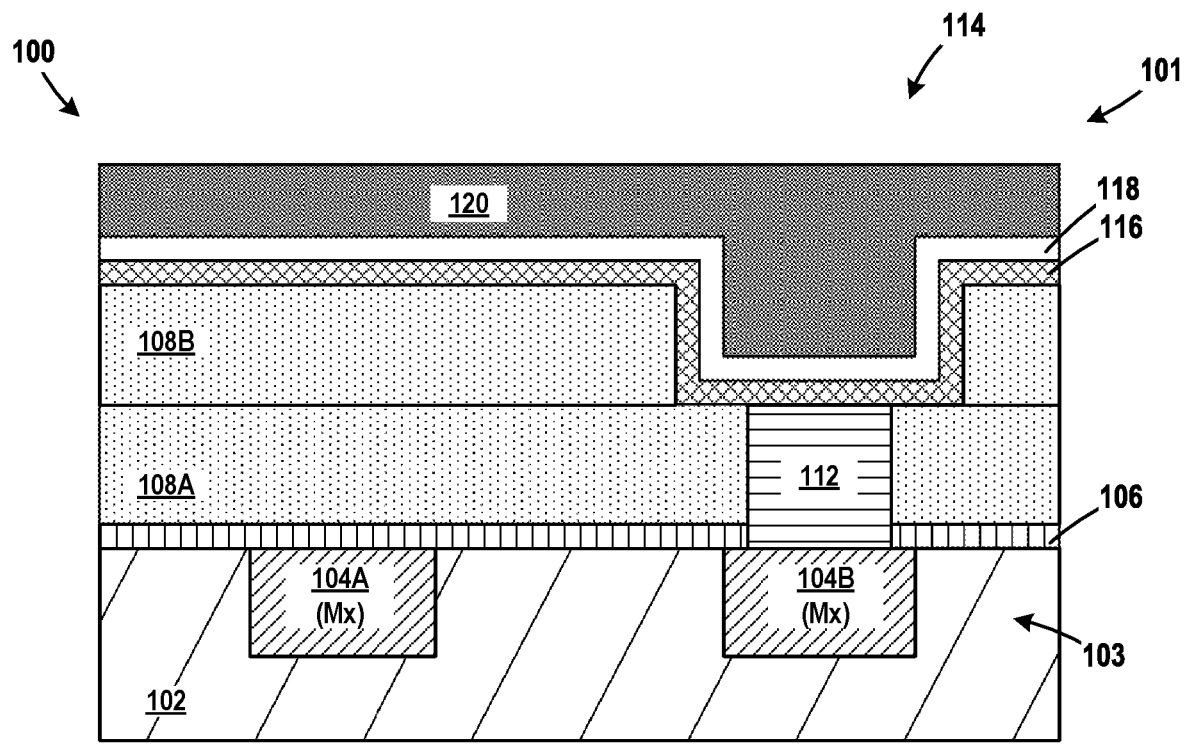

FIG. 5 depicts the IC product 100 after several process operations were performed. First, a conformal deposition process was performed to form a conformal switching layer 116 across the IC product 100 and in the opening 114. In one illustrative embodiment, the conformal switching layer 116 is formed on and in physical contact with the bottom electrode 112. Thereafter, another conformal deposition process was performed to form a conformal layer of conductive material 118 on the switching layer 116 and in the opening 114. In one illustrative embodiment, the conformal layer of conductive material 118 is formed on and in physical contact with the conformal switching layer 116. The conformal layer of conductive material 118 should be understood to be representative in nature in that it may comprise multiple conformal layers of conductive material. Next, a blanket deposition process was performed to form another conductive layer of material 120 on the IC product 100. As depicted, the conductive layer of material 120 overfills any remaining unfilled portion of the opening 114. The conductive layer of material 120 may in fact comprise multiple layers of material. In one illustrative embodiment, the conductive layer of material 120 is formed on and in physical contact with the conformal layer of conductive material 118.

The conformal switching layer 116 may be formed to any desired thickness and it may be comprised of a variety of materials, e.g., a metal oxide based material, hafnium oxide, titanium oxide, tantalum oxide, nickel oxide, zinc oxide, zinc titanate, manganese oxide, aluminum oxide, zirconium oxide, silicon dioxide, SiNx, lanthanum oxide, lanthanide oxides, etc. The conformal layer of conductive material 118 may be formed to any desired thickness and it may be comprised of a variety of different conductive materials, such as those listed above for the bottom electrode 112. The conformal layer of conductive material 118 may be comprised of the same material as that of the bottom electrode 112, but that may not be the case in all applications. The conductive layer of material 120 may be formed to any desired thickness and it may be comprised of a variety of different conductive materials, such as those listed above for the bottom electrode 112. The conductive layer of material 120 may be comprised of the same material as that of the bottom electrode 112, but that may not be the case in all applications.

Figure 6:
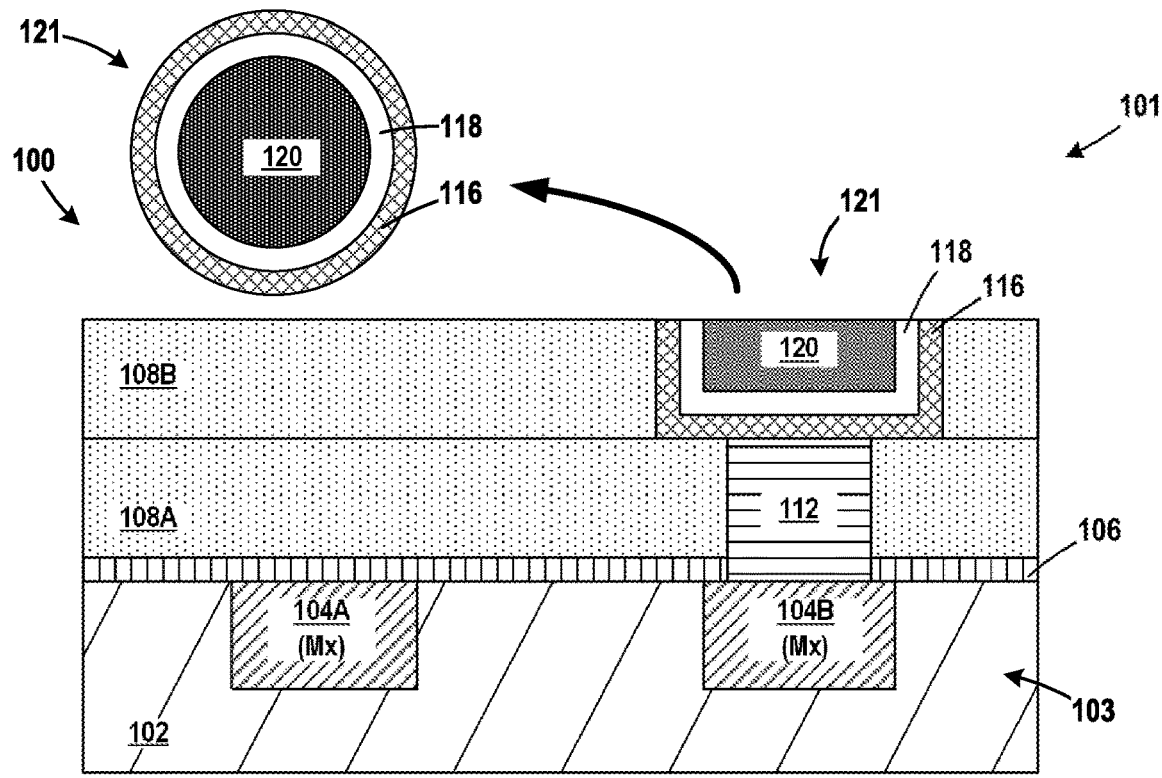

FIG. 6 depicts the IC product 100 after one or more planarization processes, e.g., CMP and/or a dry etch-back process, was performed to remove the portions of the conductive layer of material 120, the conformal layer of conductive material 118 and the switching layer 116 that were positioned on or above the upper surface of the layer of insulating material 108B and outside of the opening 114. This results in the formation of a conductive top electrode 121 (comprised of the conformal layer of conductive material 118 and the conductive layer of material 120) for the memory device 101. In one illustrative embodiment, as shown in FIG. 6, when viewed from above, the conductive top electrode 121 may have a substantially circular configuration. In other situations, the conductive top electrode 121 may have a substantially oval configuration. Note that, when viewed in vertical cross-section, due to the conformal nature of the switching layer 116, the top electrode 120 is positioned on and within the cavity or recess defined by the conformal switching layer 116. Also note that, when viewed in vertical cross-section, due to the conformal nature of the layer of conductive material 118, the conductive layer of material 120 is positioned on and within the cavity or recess defined by the conformal layer of conductive material 118. The vertical thickness of the conductive top electrode 121 may vary depending upon the particular application.

Figure 7:
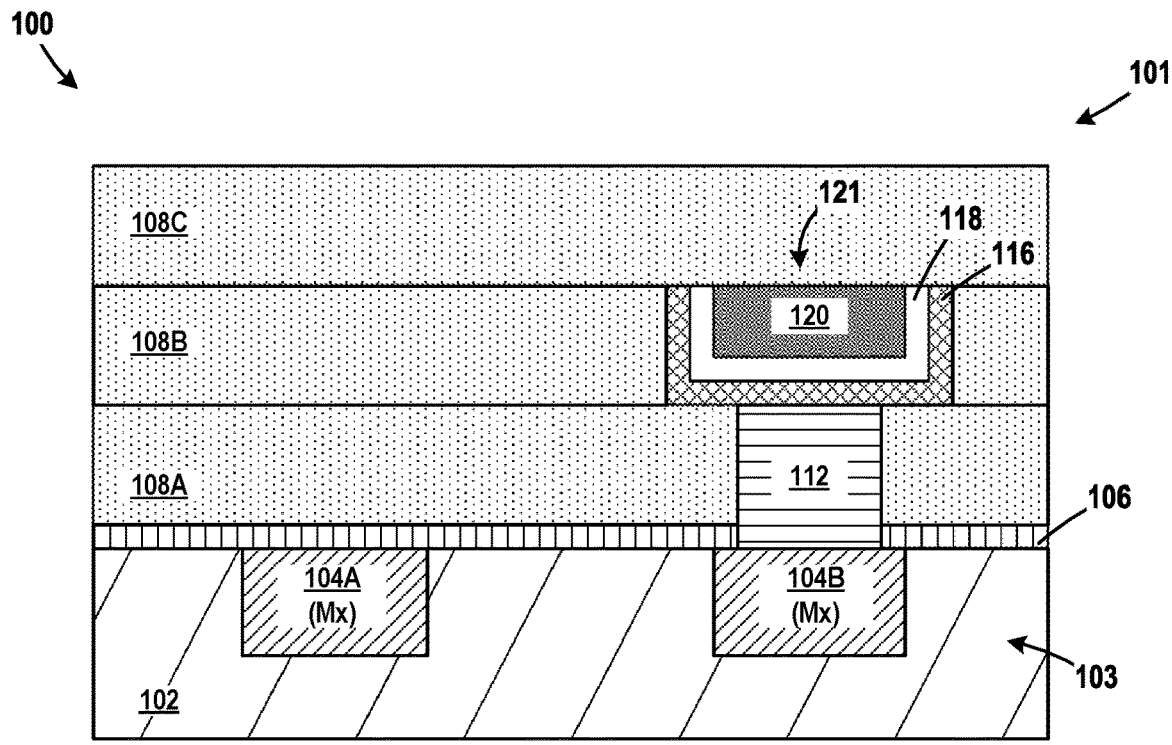

FIG. 7 depicts the IC product 100 after another representative layer of insulating material 108C was formed on the IC product 100. As before, the layer of insulating material 108C is representative in nature in that it may represent a single layer of material or multiple layers of material. The layer of insulating material 108C may be formed to any desired thickness, and it may comprise the same material as that of the layers of insulating material 108A-B, but that may not be the case in all applications. If desired, a planarization process may be performed on the layer of insulating material 108C to substantially planarize its upper surface.

Figure 8:
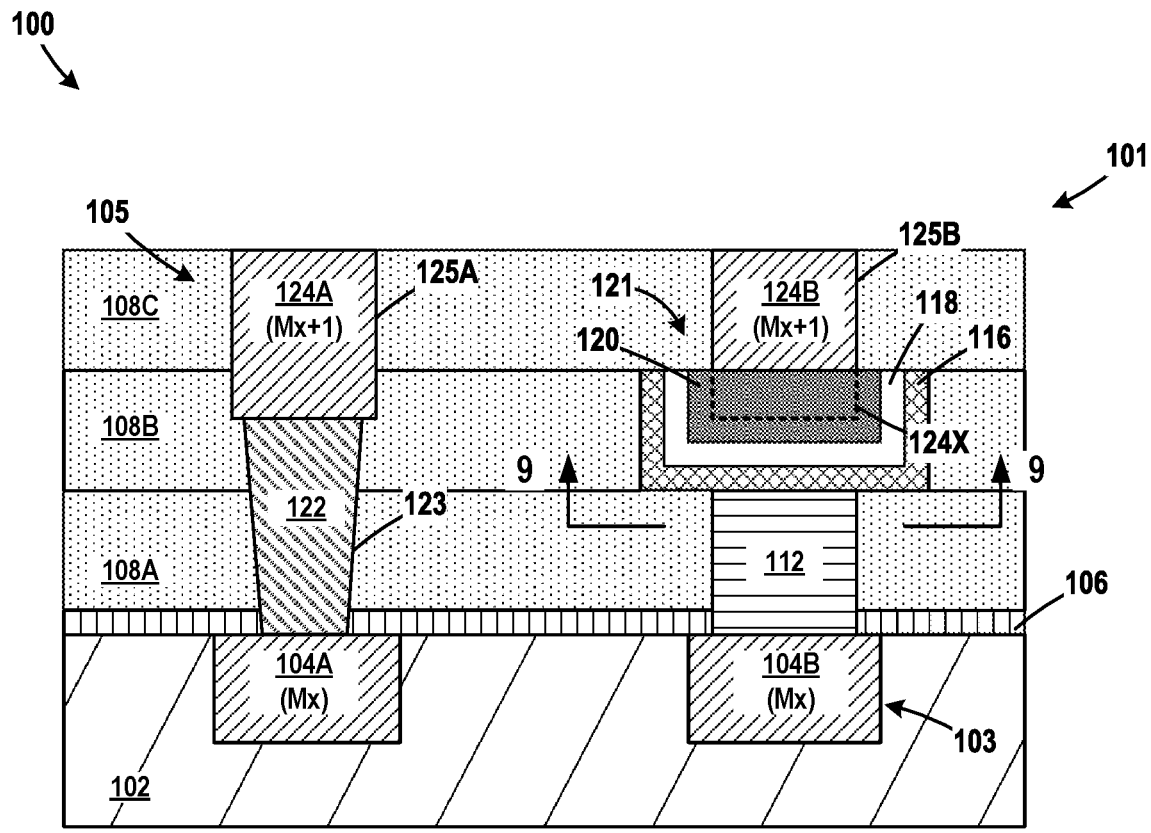

FIG. 8 depicts the IC product 100 after various process operations were performed to form various openings in the various layers of material for various conductive structures to be formed in the next metallization layer 105—Mx+1—of the IC product 100. As will be appreciated by those skilled in the art after a complete reading of the present application, there are several possible process flows for forming the conductive structures in the metallization layer 105. For example, by performing known masking and etching processes, a via opening 123 was formed that exposes the upper surface of the conductive line 104A in the metallization layer 103. Thereafter, openings 125A, 125B for various conductive lines may be formed in the various layers of insulating material 108 by performing known masking and etching techniques. In the depicted example, the opening 125A is in communication with the via opening 123, while the opening 125B exposes at least a portion of the upper surface of the top electrode 121. At that point, one or more conductive liner/barrier layers and additional conductive material were formed in the via opening and the openings 125A, 125B so as to overfill the openings 125A, 125B. At that point, one or more CMP process operations were performed to remove the conductive materials positioned outside of the openings 125A, 125B and above the upper surface of the layer of insulating material 108C. These operations result in the formation of a conductive via 122 and first and second conductive lines 124A, 124B. As depicted, the conductive line 124B is conductively coupled to the top electrode 121 of the memory device 101. The portion of the conductive line 124B positioned behind the memory device 101 is depicted by the dashed line 124X shown in FIG. 8. Also note that the upper surfaces of the plurality of conductive lines 124 in the metallization layer 105 are all substantially co-planar with one another and that one of the conductive line—124B—physically contacts an upper surface of the top electrode 121.

Figure 9:
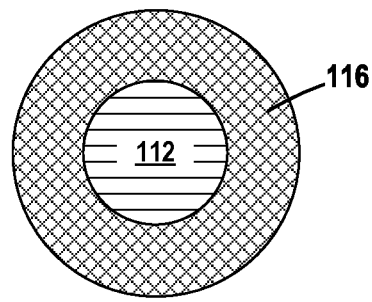

FIG. 9 is a cross sectional view taken where indicated in FIG. 8 with the insulating material 108 removed. Another novel aspect of the illustrative memory device 101 depicted herein is that the surface area defined by the bottom surface of the horizontal portion of the conformal switching layer 116 is larger than the surface area defined by the upper surface of the bottom electrode 112. The magnitude of this difference in surface areas may vary depending upon the particular application. Of course, in other embodiments, the surface area defined by the bottom surface of the horizontal portion of the conformal switching layer 116 may be less than the surface area defined by the upper surface of the bottom electrode 112. Additionally, as noted above, both the conformal switching layer 116 and the conformal layer of conductive material 118 comprise a horizontally oriented portion and vertically oriented portions due to the conformal nature of the processes used to form these materials. Also note that the conformal switching layer 116 wraps around the generally cylindrical side surface and the bottom surface of the top electrode 121.

As will be appreciated by those skilled in the art after a complete reading of the present application, the conformal switching layer 116 and the top electrode 121 of the memory device were all formed without performing an etching process, thereby tending to reduce undesirable damage to the memory device, and particularly the conformal switching layer 116, all of which may help to improve device performance. Additionally, given that the top electrode 121 is physically contacted by the metal line 124B, the electrical routing for the memory device can be accomplished within the metallization layer 105 instead of the next, higher metallization layer as was the case with at least some prior art memory devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is there-fore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A device, comprising:
    a bottom electrode, wherein the bottom electrode is a solid cylinder and includes an upper surface that defines a first surface area;
    a conformal switching layer positioned above the bottom electrode; and
    a top electrode positioned above the conformal switching layer, the top electrode comprising:
        a conformal layer of conductive material positioned above the conformal switching layer; and
        a conductive material positioned above the conformal layer of conductive material,
    wherein the conformal switching layer comprises a horizontally oriented portion with a bottom surface that defines a second surface area, and wherein the second surface area is greater than the first surface area, and wherein the conformal switching layer defines a first recess and wherein the conformal layer of conductive material is positioned within the first recess and on the conformal switching layer.

2. The device of claim 1, wherein the conformal switching layer is positioned on and in physical contact with the bottom electrode, the conformal layer of conductive material is positioned on and in physical contact with the conformal switching layer, and the conductive material is positioned on and in physical contact with the conformal layer of conductive material.

3. The device of claim 1, wherein the conformal layer of conductive material comprises a plurality of conformal layers of one or more conductive materials.

4. The device of claim 1, wherein the device is an RRAM (resistive random access memory) device.

5. The device of claim 1, wherein the bottom electrode comprises one of a metal, a metal alloy, copper, tungsten, aluminum, Pt, TiN or TaN, the conformal switching layer comprises one of a metal oxide, hafnium oxide, titanium oxide, tantalum oxide, nickel oxide, zinc oxide, zinc titanate, manganese oxide, aluminum oxide or zirconium oxide, the conformal layer of conductive material comprises one of a metal, a metal alloy, copper, tungsten, aluminum, Pt, TiN or TaN, and the conductive material comprises one of a metal, a metal alloy, copper, tungsten, aluminum, Pt, TiN or TaN.

6. The device of claim 1, wherein the conformal layer of conductive material defines a second recess and wherein the conductive material is positioned within the second recess and on the conformal layer of conductive material.

7. The device of claim 1, further comprising a metallization layer comprising a plurality of conductive lines positioned within at least one layer of insulating material, wherein an upper surface of each of the plurality of conductive lines are substantially co-planar with one another and wherein one of the conductive lines physically contacts an upper surface of the top electrode.

8. The device of claim 1, wherein the conformal switching layer comprises a substantially horizontally oriented portion and substantially vertically oriented portions and wherein the conformal layer of conductive material comprises a substantially horizontally oriented portion and substantially vertically oriented portions.

9. The device of claim 1, wherein the top electrode comprises a bottom surface and a generally cylindrical side surface, wherein the conformal switching layer wraps around the bottom surface of the top electrode and the generally cylindrical side surface of the top electrode.

10. A device, comprising:
    a bottom electrode, wherein the bottom electrode is a solid cylinder and includes an upper surface that defines a first surface area;
    a conformal switching layer positioned on and in physical contact with the bottom electrode;
    a top electrode positioned on and in physical contact with the conformal switching layer, the top electrode comprising:
        a conformal layer of conductive material positioned on and in physical contact with the conformal switching layer; and
        a conductive material positioned on and in physical contact with the conformal layer of conductive material; and
    a metallization layer comprising a plurality of conductive lines positioned within at least one layer of insulating material, wherein an upper surface of each of the plurality of conductive lines are substantially co-planar with one another and wherein one of the conductive lines physically contacts an upper surface of the top electrode,
    wherein the conformal switching layer comprises a horizontally oriented portion with a bottom surface that defines a second surface area, and wherein the second surface area is greater than the first surface area, and wherein the conformal switching layer positioned above the bottom electrode defines a first recess and wherein the conformal layer of conductive material is positioned within the first recess and on the conformal switching layer.

11. The device of claim 10, wherein the conformal layer of conductive material comprises a plurality of conformal layers of one or more conductive materials.

12. The device of claim 10, wherein the conformal layer of conductive material defines a second recess and wherein the conductive material is positioned within the second recess and on the conformal layer of conductive material.

13. The device of claim 10, wherein the top electrode comprises a bottom surface and a generally cylindrical side surface, wherein the conformal switching layer wraps around the bottom surface of the top electrode and the generally cylindrical side surface of the top electrode.

14. The device of claim 1, wherein an entirety of the conformal switching layer and an entirety of the top electrode are positioned above the bottom electrode.

15. The device of claim 10, wherein an entirety of the conformal switching layer and an entirety of the top electrode are positioned above the bottom electrode.

* * * * *